United States Patent
Lee

(10) Patent No.: US 8,729,395 B2
(45) Date of Patent: May 20, 2014

(54) WIRE BONDING JOINT STRUCTURE OF JOINT PAD, AND METHOD FOR PREPARING THE SAME

(75) Inventor: Dong Jun Lee, Gyeonggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 186 days.

(21) Appl. No.: 13/472,281

(22) Filed: May 15, 2012

(65) Prior Publication Data

US 2013/0000966 A1    Jan. 3, 2013

(30) Foreign Application Priority Data

Jun. 28, 2011   (KR) .................. 10-2011-0062943

(51) Int. Cl.
| | |
|---|---|
| H01B 5/00 | (2006.01) |
| H05K 1/03 | (2006.01) |
| H05K 1/11 | (2006.01) |
| H05K 7/10 | (2006.01) |
| H01R 43/04 | (2006.01) |

(52) U.S. Cl.
USPC ........ 174/126.2; 174/255; 174/261; 361/767; 29/861

(58) Field of Classification Search
USPC ........... 174/126.2, 255, 261; 361/767; 29/861
See application file for complete search history.

(56) References Cited

U.S. PATENT DOCUMENTS

| | | | | |
|---|---|---|---|---|
| 6,280,828 | B1* | 8/2001 | Nakatsuka et al. | 428/209 |
| 6,445,069 | B1* | 9/2002 | Ling et al. | 257/738 |
| 2005/0001324 | A1* | 1/2005 | Dunn et al. | 257/762 |
| 2005/0104207 | A1* | 5/2005 | Dean et al. | 257/734 |
| 2010/0089613 | A1* | 4/2010 | Takayanagi et al. | 174/126.2 |

FOREIGN PATENT DOCUMENTS

JP    2000-312058    11/2000

* cited by examiner

*Primary Examiner* — Timothy Thompson
*Assistant Examiner* — Sherman Ng
(74) *Attorney, Agent, or Firm* — McDermott Will & Emery LLP

(57) ABSTRACT

A wire bonding joint structure of a joint pad in which electroless surface treatment plating layers of joint pads configured by a nickel layer/a palladium layer/a gold layer are connected to each other by a metal wire and when the metal wire is joined to the electroless surface treatment plating layer, a depth of the wire bonding pad formed by wedge deformation is 1.0 m or more.

The electroless surface treatment layer of the joint pad can lower strength and hardness of the wire bonding pad of which the surface is treated to improve follow-up capability between a gold wire and the bonding pad, such that a joint area between the gold and the bonding pad is maximized, thereby increasing joinability at the wire bonding finish process by wedge pressure and greatly improving wire bonding workability.

8 Claims, 4 Drawing Sheets

- PRIOR ART -

- PRIOR ART -

- PRIOR ART -

- PRIOR ART -

- PRIOR ART -

WIRE BONDING JOINT STRUCTURE OF JOINT PAD, AND METHOD FOR PREPARING THE SAME

CROSS REFERENCE(S) TO RELATED APPLICATIONS

This application claims the benefit under 35 U.S.C. Section 119 of Korean Patent Application Serial No. 10-2011-0062943, entitled "Wire bonding joint structure of joint pad, and method for preparing the same" filed on Jun. 28, 2011, which is hereby incorporated by reference in its entirety into this application.

BACKGROUND OF THE INVENTION

1. Technical Field

The present invention relates to a wire bonding joint structure of a joint pad, a method for preparing the same, and a printed circuit board including the same.

2. Description of the Related Art

Due to high integration of electronic parts, a technology of treating a surface of a printed circuit board (PCB) is diversified. Recently, as a demand for thin and highly integrated PCB products is increased, the surface treatment technology has been changed from an electrolytic Ni/Au surface treatment technology to an electroless surface treatment technology capable of easily implementing tailess so as to implement process simplification, noise free, or the like.

In particular, electroless Ni/Au (hereinafter, referred to as ENIG) used in the related art and electroless Ni/Pd/Au (hereinafter, referred to as ENEPIG) recently interested have good solder joint reliability and wire bonding reliability and as a result, has been used for various fields in addition to a package substrate. However, as wirings are miniaturized so as to highly integrate electronic parts, problems of the technologies for treating the surface of the circuit board according to the related art start to appear.

Next, FIGS. 1A and 1B each are a diagram showing a cross section when devices are connected to each other using a wire bonding method of the related art and a diagram viewed from the top.

Referring to FIGS. 1A and 1B, a polymer resin layer 20 that is formed in a portion except for a copper layer 10 on a printed circuit board serves as a resist for subsequent plating. As plating layers 30 for protecting the copper layer 10, Ni 31/Pd 32/Au 33 are formed. In addition, after the Ni/Pd/Au plating layers 30 are formed, metals are interconnected with each other by using an Au wire.

For example, FIGS. 2A to 2C are scanning electron microscope photographs of wire bonding pads connected by an Au wire according to the related art. When the electroless surface treatment has the electroless Ni/Au plating layers or the electroless Ni/Pd/Au plating layers, a thickness of each layer at the electroless Ni/Au is Ni at 3 μm or more and Au at 0.05 to 0.5 μm and a thickness of each layer at the electroless Ni/Pd/Au is Ni at 3 μm or more as the minimum, Pd at 0.05 to 0.3 μm, and Au at 0.05 to 0.5 μm.

The method of connecting a copper joint pad having the plating layers subjected to the electroless surface treatment and external devices by the Au wire bonding joints an electroless plating later on a Ni layer or a Ni—P layer that structurally has high hardness, such that it is not suitable for joining at the time of the wire bonding.

That is, the thickness of the Ni 31 is 3 μm or more as the minimum. In addition, the Ni layer having the thickness includes P (phosphorous) impurity of contents of about 6 to 9 wt %, such that the hardness of Ni is increased. When the hardness of Ni is increased, the Au wire is joined to the bonding pad and then, a deformation depth of the bonding pad is formed within about 1.0 μm by a wedge pressure in a final work that disconnects the wire bonding (see FIG. 2B). Therefore, the increase in the hardness may reduce wire bonding workability (see FIG. 2C).

Recently, an Au wire diameter is small and an Au thickness at a surface finish is also thin, due to the increase in the Au value, such that the wire bonding workability is reduced. Therefore, the improvements thereof are urgently needed.

SUMMARY OF THE INVENTION

An object of the present invention is to provide a wire bonding joint structure of a joint pad capable of improving follow-up capability between a gold wire and a bonding pad by lowering strength and hardness of a wire bonding pad of which the surface is treated.

Another object of the present invention is to provide a method for preparing a wire bonding joint structure of a joint pad.

Another object of the present invention is to provide a printed circuit board including a wire bonding joint structure of a joint pad.

According to an exemplary embodiment of the present invention, there is provided a wire bonding joint structure of a joint pad, wherein electroless surface treatment plating layers of joint pads made of a nickel (Ni) layer/a palladium (Pd) layer/a gold (Au) layer are connected to each other by a metal wire and when the metal wire is joined to the electroless surface treatment plating layers, a depth of a wire bonding pad formed by wedge deformation is 1.0 μm or more.

A thickness of the nickel (Ni) layer may be 1 μm or less in the electroless surface treatment plating layer.

A thickness of each of the electroless surface treatment plating layers made of the nickel (Ni) layer/the palladium (Pd) layer/the gold (Au) layer may be set to be 0.02 to 1 μm/0.01 to 0.3 μm/0.01 to 0.5 μm.

The metal wire may be copper (Cu) or gold (Au).

According to an exemplary embodiment of the present invention, there is provided a method for preparing a wire bonding joint structure of a joint pad, including: forming electroless surface treatment plating layers sequentially made of nickel (Ni)/palladium (Pd)/gold (Au) on a joint pad; connecting the plating layers by a metal wire; and disconnecting and finishing the plating layers and the metal wire so that a depth of a wire bonding pad formed by wedge deformation is 1.0 μm or more when the metal wire is joined to the electroless surface treatment plating layers.

The thickness of the electroless nickel, palladium, and gold plating coating may be set to be 0.02 to 1 μm, 0.01 to 0.3 μm, and 0.01 to 0.5 μm, respectively.

The electroless gold plating coating may be formed by a substitution/reduction type.

According to another exemplary embodiment of the present invention, there is provided a printed circuit board including the wire bonding joint structure of a joint pad.

DESCRIPTION OF THE PREFERRED EMBODIMENTS

Figure 1A:
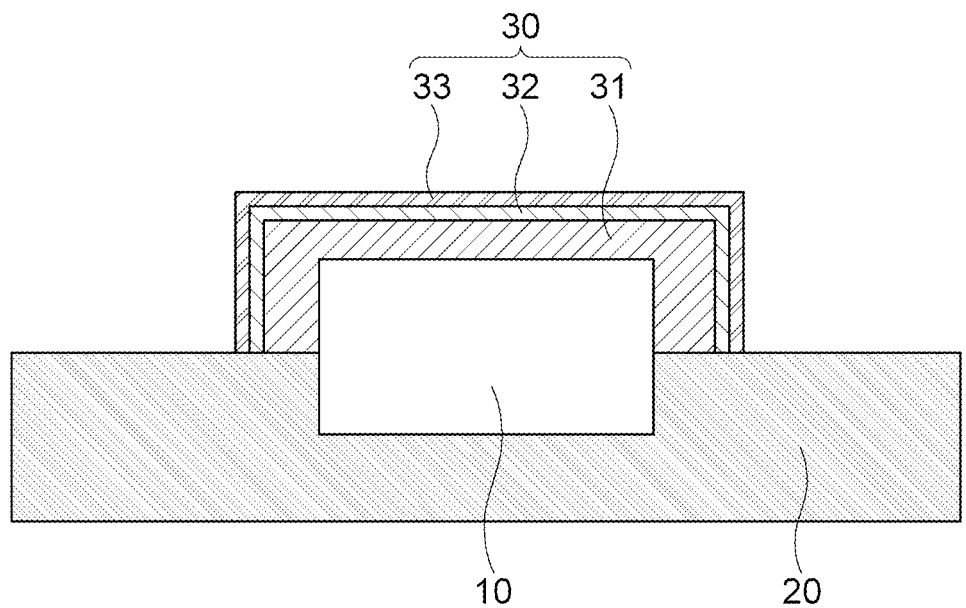
FIGS. 1A and 1B are diagrams showing a shape of a cross section A and a top portion B when devices are connected to each other by using a wire bonding method according to the related art.
Figure 1B:
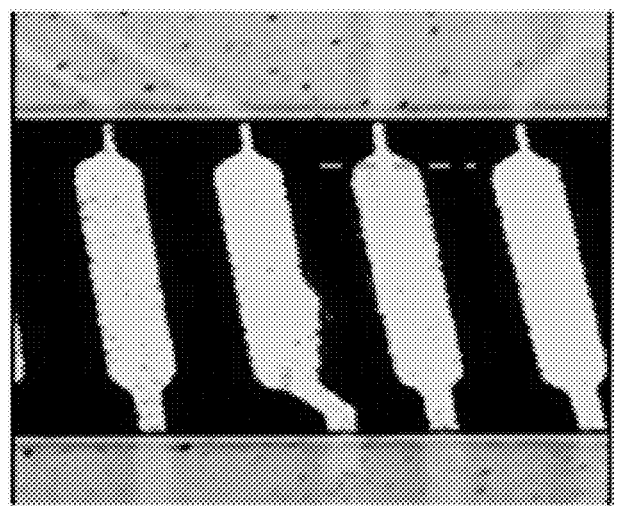

Hereinafter, the present invention will be described in more detail.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

An exemplary embodiment of the present invention relates to a wire bonding joint structure of a joint pad capable of improving wire bonding workability by maximizing a joint area due to wedge deformation at a joining finish process when a surface treatment metal layer of an outer layer metal exposure part of an electronic device is joined to a metal wire by a wire bonding method, a method for preparing the same, and a printed circuit board including the same.

In the wire bonding joint structure of the joint pad according to the exemplary embodiment of the present invention, the surface treatment metal layer of the outer layer metal exposure part of the electronic device is made of Ni/Pd/Au. Meanwhile, when the metal layers are connected by the metal wire, a thickness of the Ni layer is minimized, thereby lowering hardness of Ni. In this case, when the metal wire is joined to electroless surface treatment plating layers, a depth of the wire bonding pad formed by wedge deformation is increased, that is, a joint area is maximized by wedge deformation, such that joinability is increased at a wire bonding finish process by wedge pressure.

In the wire bonding joint structure of the joint pad, the electroless surface treatment plating layers of the joint pad configured by a nickel (Ni) layer/a palladium (Pd) layer/a gold (Au) layer are connected to each other by the metal wire and when the metal wire is joined to the electroless surface treatment plating layers, the depth of the wire bonding pad formed by the wedge deformation is 1.0 μm or more.

When the metal wire is joined to the electroless surface treatment plating layers, when the depth of the wire bonding pad formed by the wedge deformation is below 1.0 μm, the workability may be degraded at the wire bonding finish process.

An underlayer of the electroless surface treatment plating layer, that is, a copper joint pad has a pushing force at the wire bonding finish process, thereby degrading workability. Therefore, after the wire bonding joining ends, there is a need for the depth (area) of the wire bonding pad formed by the wedge deformation sufficient to absorb the wedge pressure to some degree during the finish work that disconnects the metal wire bonding.

To this end, the exemplary embodiment of the present invention finely forms the thickness of the Ni layer to be 1 μm or less, thereby solving the problem in that the depth of the wedge deformation is formed below 1.0 μm due to the increase in hardness when the thickness of the Ni layer is formed at 3 μm or more as in the related art.

The thickness of each of the electroless surface treatment plating layers configured by the nickel (Ni) layer/the palladium (Pd) layer/the gold (Au) layer may be set to be 0.02 to 1 μm/0.01 to 0.3 μm/0.01 to 0.5 μm.

When the nickel coating thickness exceeds 1 μm, the hardness is increased, such that the joint area between the metal wire and the bonding pad that are formed by the wedge deformation at the wire bonding finish process may not be formed at 1.0 μm or more.

The electroless Pd coating 132 serves to suppress corrosion of the nickel layer by substitution reaction at the time of plating immersion Au. The electroless palladium coating according to the exemplary embodiment of the present invention may have a thickness of 0.01 to 0.5 μm. When the thickness of the electroless palladium (Pd) coating exceeds 0.3 μm, costs may be increased.

The electroless Au coating 133 serves to suppress formation of an oxide film during storage. The electroless gold coating according to the exemplary embodiment of the present invention may have a thickness of 0.01 to 0.3 μm. When the thickness of the electroless Au coating exceeds 3 μm, costs may be increased.

As described above, the electroless Ni/Pd/Au surface treatment plating layers 130 are formed and then, connected to each other by a wire bonding method using a gold (Au) wire, or the like.

The metal wire may be copper (Cu) or gold (Au).

A method for preparing a wire bonding joint structure of a joint pad according to an exemplary embodiment of the present invention will be described below. First, the electroless surface treatment plating layers sequentially made of nickel (Ni)/palladium (Pd)/gold (Au) are formed on the joint pad such as copper.

A nickel, palladium, and gold plating solution configuring the electroless surface treatment plating layers according to the exemplary embodiment of the present invention may be used without being limited if they are known to those skilled in the art. In addition, any plating methods may be used without being particularly limited if they depend on a general level.

However, the electroless surface treatment plating layers according to the exemplary embodiment of the present invention require a condition in which the electroless nickel, palladium, and gold plating coating is plated within a range of a thickness of 0.02 to 1 μm, 0.01 to 3 μm, and 0.01 to 5 μm, respectively.

According to the exemplary embodiment of the present invention, the electroless gold plating coating may be formed by a substitution/reduction type. When the electroless gold plating coating is formed by a general substitution type, corrosion pits are formed on the densely formed electroless Ni coating and electroless Pd coating, thereby degrading the copper diffusion prevention capability. However, when the electroless gold plating coating is formed by the substitution/reduction type, it is ultra-instantaneously subjected to the substitution reaction at reaction initialization, such that the Ni coating and the Pd coating do not suffer any attacks, thereby obtaining the plating layer having the dense structure.

In addition, a second process is a process of connecting the plating layers by the metal wire. The metal wire may use copper (Cu) or gold (Au).

Finally, when the metal wire is joined to the electroless surface treatment plating layers, the method includes a finish process of disconnecting between the plating layers and the metal wire so that the depth of the wire bonding pad formed by the wedge deformation is 1.0 μm or more.

In the exemplary embodiment of the present invention, since the hardness of Ni is lower than that of the related art by minimizing the thickness of the nickel plating coating, the depth (joint area) of the wire bonding pad formed by the wedge deformation between the metal wire and the electroless surface treatment plating layers is maximized at the finish process of the wire bonding work, thereby improving the wire bonding workability.

Hereinafter, preferred examples of the present invention will be described in detail with reference to the accompanying drawings. However, these examples only describes the present invention and therefore, the scope of the present invention should not be construed as being limited to these examples.

EXAMPLE 1

1) Electroless Ni Plating

The electroless nickel plating coating having a thickness of 0.1 μm was obtained by immersing the substrate subjected to the pre-treatment process in the electroless Ni plating solution (products TOP NICORON LPH-LF available from OKUNO Co.) containing 6 to 9 wt % of phosphorus included in the plating coating on the copper layer at 65° C. for 1 minute and then, washing it for 2 minutes.

2) Electroless Pd Plating

The electroless palladium plating coating having a thickness of 0.1 μm was obtained by immersing the substrate subjected to the electroless Ni plating in the electroless Pd plating solution, that is, XTP (pH 7.2; products available from UYEMURA) at 50° C. for 10 minutes and washing it for 2 minutes.

3) Electroless Au Plating

The electroless nickel/palladium/gold plating layers formed with the electroless gold plating coating of a thickness of 0.1 μm were obtained by immersing the substrate to which the electroless Ni and palladium are plated in the electroless gold plating solution (product GoBright TSB-72 available from UYEMURA Co.) at 80° C. for 5 minutes and washing it for 2 minutes, and then, drying it for 5 minutes by a blowing drier.

4) Wire Bonding

The electroless nickel/palladium/gold surface treatment plating layers were connected with the external devices by the gold wire. In addition, the wire bonding joint structure of the joint pad was obtained by cutting the wire bonding part at the wire bonding work finish process.

Comparative Example 1

The thickness of the nickel/palladium/gold plating layers was formed at 5 μm/1 μm/1 μm, the electroless nickel/palladium/gold plating layers were formed by the same process as Example 1, and the wire bonding work was performed.

Experimental Example 1

The cross section photograph of the wire bonding joint structure obtained according to the above Example and Comparative Example and the joint area formed by the wedge deformation were observed by the scanning electron microscope. The results are shown in FIGS. 4 and 5 and FIGS. 2B and 2C.

Figure 2A:
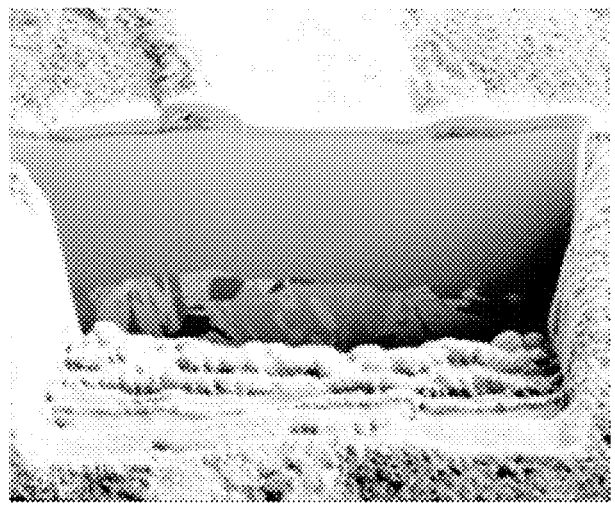
FIGS. 2A to 2C are diagrams showing scanning electron microscope photographs of wire bonding pads connected by an Au wire according to the related art.
Figure 2B:
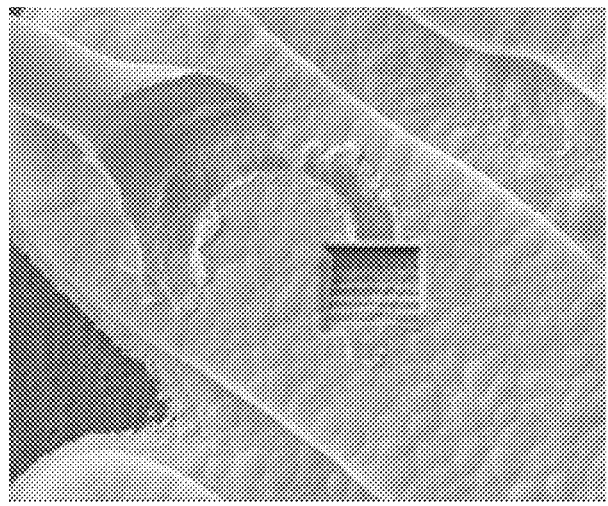

In the case of the above Comparative Example in which the nickel layer is thickly formed at 3 μm or more in the electroless surface treatment plating layers, it could be appreciated that the deformation depth of the wire bonding pad formed by the wedge deformation due to the nickel layer having high hardness is formed at about 1.0 μm during the wire bonding finish work to degrade the wire bonding workability (FIG. 2B).

Figure 2C:
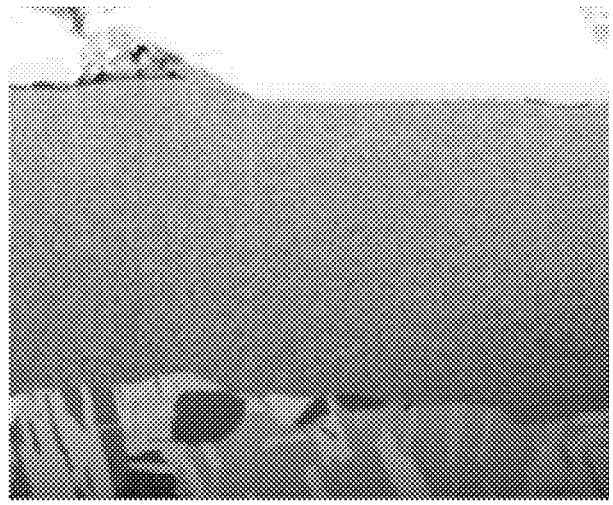

When the metal wire is joined to the electroless surface treatment plating layers, the depth of the wire bonding pad formed by the wedge deformation has a deformation depth below 1 μm as can be appreciated from FIG. 2C since there is almost no deformation when the nickel layer having high hardness is thick, as compared with the case in which the existing nickel layer is thick with the case in which the existing nickel layer is thin.

Figure 3:
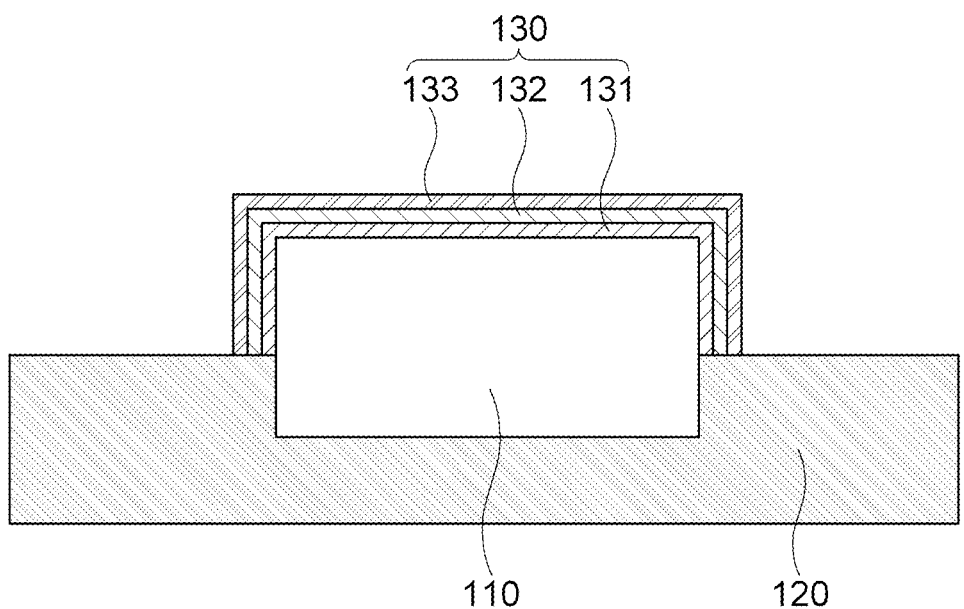
FIG. 3 is a diagram showing a wire bonding joint structure of a joint pad according to an exemplary embodiment of the present invention.
Figure 4:
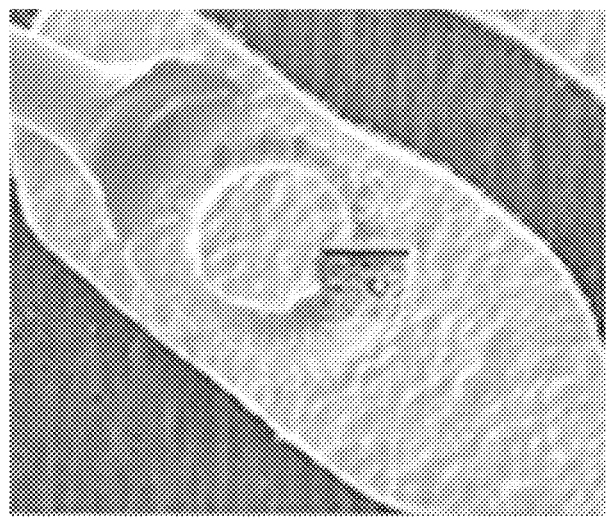
FIGS. 4 and 5 are diagrams showing scanning electron microscope photographs of the wire bonding pads connected by an Au wire according to the exemplary embodiment of the present invention.
Figure 5:
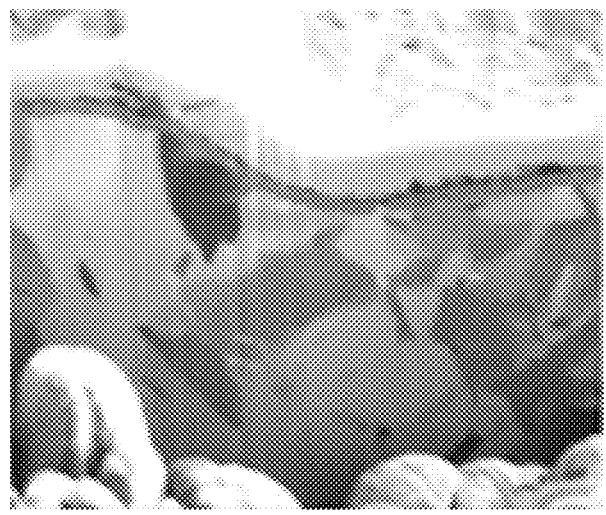

However, as in the wire bonding joint structure according to the exemplary embodiment of the present invention, when the thickness of the Ni layer is reduced (FIGS. 3 and 4), it could be appreciated that the wedge deformation depth may reach approximately 3 μm at the time of the wire bonding (FIG. 5). From this, it could be appreciated that a considerable amount of energy is used for deformation at the time of the wire bonding and the repulsive force pushing the capillary of the wire bonding is relatively small. The workability may be improved by reducing the repulsive force at the time of the wire bonding.

As set forth above, the electroless surface treatment layer of the joint pad according to the exemplary embodiment of the present invention can lower the strength and hardness of the wire bonding pad of which the surface is treated to improve the follow-up capability between the gold wire and the bonding pad, such that the joint area between the gold and the bonding pad is maximized, thereby increasing the joinability at the wire bonding finish process by the wedge pressure and greatly improving the wire bonding workability.

While the present invention has been shown and described in connection with the embodiments, it will be apparent to those skilled in the art that modifications and variations can be made without departing from the spirit and scope of the invention as defined by the appended claims.

What is claimed is:

1. A wire bonding joint structure of a joint pad, wherein electroless surface treatment plating layers of joint pads made of a nickel (Ni) layer/a palladium (Pd) layer/a gold (Au) layer are connected to each other by a metal wire and when the metal wire is joined to the electroless surface treatment plating layers, a depth of a wire bonding pad formed by wedge deformation is 1.0 μm or more.

2. The wire bonding joint structure of a joint pad according to claim 1, wherein a thickness of the nickel (Ni) layer is 1 μm or less in the electroless surface treatment plating layer.

3. The wire bonding joint structure of a joint pad according to claim 1, wherein a thickness of each of the electroless surface treatment plating layers made of the nickel (Ni) layer/the palladium (Pd) layer/the gold (Au) layer is set to be 0.02 to 1 μm/0.01 to 0.3 μm/0.01 to 0.5 μm.

4. The wire bonding joint structure of a joint pad according to claim 1, wherein the metal wire is the joint pad made of copper (Cu) or gold (Au).

5. A method for preparing a wire bonding joint structure of a joint pad, comprising:

forming electroless surface treatment plating layers sequentially made of nickel (Ni)/palladium (Pd)/gold (Au) on a joint pad;

connecting the plating layers by a metal wire; and disconnecting and finishing the plating layers and the metal wire so that a depth of a wire bonding pad formed by wedge deformation is 1.0 μm or more when the metal wire is joined to the electroless surface treatment plating layers.

6. The method according to claim 5, wherein the thickness of the electroless nickel, palladium, and gold plating layer is set to be 0.02 to 1 μm, 0.01 to 0.3 μm, and 0.01 to 0.5 μm, respectively, 7. The method according to claim 5, wherein the electroless gold plating layer is formed by a substitution/reduction type.

8. A printed circuit board including the wire bonding joint structure of a joint pad according to claim 1.

* * * * *